United States Patent [19]

Wise

[11] Patent Number: 4,859,626
[45] Date of Patent: Aug. 22, 1989

[54] METHOD OF FORMING THIN EPITAXIAL LAYERS USING MULTISTEP GROWTH FOR AUTODOPING CONTROL

[75] Inventor: Rick L. Wise, Sherman, Tex.

[73] Assignee: Texas Instruments Incorporated, Dallas, Tex.

[21] Appl. No.: 202,731

[22] Filed: Jun. 3, 1988

[51] Int. Cl.⁴ .................. H01L 21/20; H01L 21/205
[52] U.S. Cl. ........................ 437/81; 148/DIG. 7; 148/DIG. 15; 148/DIG. 25; 148/DIG. 29; 156/613; 437/95; 437/97; 437/110; 437/112; 437/946
[58] Field of Search ............... 148/DIG. 7, DIG. 15, 148/17, 24, 25, 29, 32, 35, 41, 145, 169, 33, 35.5; 156/610–615; 437/81, 95, 97, 108, 110, 111, 112, 939, 946, 971, 970

[56] References Cited

U.S. PATENT DOCUMENTS

| | | | |
|---|---|---|---|
| 3,189,494 | 6/1965 | Short | 437/95 |
| 3,660,180 | 5/1972 | Wajda | 437/95 |
| 3,669,769 | 6/1972 | Badami et al. | 437/95 |
| 3,716,422 | 2/1973 | Ing et al. | 437/95 |
| 3,765,960 | 10/1973 | Boss et al. | 437/95 |
| 3,847,686 | 11/1974 | Stein | 437/95 |
| 3,929,526 | 12/1975 | Nuttall et al. | 437/95 |
| 4,153,486 | 5/1979 | Srinivasan | 437/95 |
| 4,349,394 | 9/1982 | Wei | 437/95 |
| 4,497,683 | 2/1985 | Celler et al. | 437/89 |
| 4,592,792 | 6/1986 | Corboy, Jr. et al. | 437/89 |
| 4,696,701 | 9/1987 | Sullivan | 148/33.5 |
| 4,786,615 | 11/1988 | Liaw et al. | 437/90 |

FOREIGN PATENT DOCUMENTS

| | | | |
|---|---|---|---|
| 0196524 | 8/1986 | Japan | 437/95 |
| 0177913 | 8/1987 | Japan | 437/95 |

OTHER PUBLICATIONS

Srinivasan, Gurumakonda R., "Modeling and Applications of Silicon Epitaxy in Silicon Processing", ASTM STP 804, ED.D.C. Gupta (Am. Soc. for Testing and Materials, 1983), pp. 152–173.
Ishii, T., et al., "Silicon Epitaxial Wafer with Abrupt Interface by Two-Step Epitaxial Growth Technique", J. Electrochem. Soc. vol. 122, Nov. 1975, pp. 1523–1531.
Chang, H., "Defect Control for Silicon Epitaxial Processing Using Silane, Dichlorosilane, and Silicon Tetrachloride", Proc. Symp. on Defects in Silicon (Electrochem. Soc. Pennington, N.J., 1983) pp. 549–556.
Wise, Rick L., "A Closer Look at Low—Temperature Deposition of Epitaxial Silicon Using Dichlorosilane for Advanced Bipolar Semiconductor Applicants", Electrochemical Society CVD-X, 10–87.
Bratter et al., "Epitaxial Deposition Process", IBM TDB, vol. 15, No. 2, Jul. 1972, p. 684.
Srinivasan, "Recent Advances in Silicon Epitaxy . . . ", J. Cryt. Growth, vol. 70, 1984, pp. 201–217.
Silvestri et al., "Submicron Epitaxial Films," J. Electrochem. Soc., vol. 131, No. 4, Apr. 1984, pp. 877–81.

Primary Examiner—Brian E. Hearn
Assistant Examiner—William Bunch
Attorney, Agent, or Firm—Michael E. Melton; Leo N. Heiting; Melvin Sharp

[57] ABSTRACT

A method of forming thin epitaxial layers by subjecting a substrate to a high temperature prebake followed by a medium temperature capping seal and a low temperature deposition is disclosed. In a preferred embodiment the epitaxial layer is formed by low pressure chemical vapor deposition of dichlorosilane. The method has been demonstrated to alleviate the increase in autodoping and epitaxial defects normally associated with lowering the deposition temperature.

10 Claims, 1 Drawing Sheet

METHOD OF FORMING THIN EPITAXIAL LAYERS USING MULTISTEP GROWTH FOR AUTODOPING CONTROL

BACKGROUND OF THE INVENTION

The present invention relates generally to the formation of thin epitaxial layers and relates more particularly to the formation of thin epitaxial layers by Chemical Vapor Deposition with dichlorosilane.

An integral part of the Bipolar Integrated Circuit is the epitaxial layer which serves as the collector and provides a highly ordered crystalline layer into which subsequent diffusions and implants of dopants can be made. A buried sub-collector is diffused or implanted into patterned areas of the substrate before the epitaxial layer is grown by, for example, Chemical Vapor Deposition (CVD). For fabrication of n-p-n transistors within the IC, n-type epitaxial silicon is deposited above the heavily doped n-type buried layer (sub-collector). The dopant concentration is typically about three orders of magnitude higher in the buried layer than in the epitaxial layer.

In view of the ever increasing desire to manufacture semiconductor devices with smaller geometries, the need has arisen to develop a satisfactory method for forming thinner epitaxial layers for bipolar devices. The conventional practice of depositing epitaxial layers at relatively high temperatures, for example in the temperature range of 1050° C. to 1150° C., does not produce epitaxial layers of optimum quality in the 1 to 2 micron range. Degradation of the epitaxy is primarily caused by updiffusion of the buried layer into the epitaxy due to the high temperature deposition. As a result, the usable, or effective, epitaxial thickness above the sub-collector is reduced by the extent of this updiffusion.

The obvious solution of lowering the epitaxial deposition temperature to minimize buried layer updiffusion creates a separate set of problems such as an increase in autodoping of n-type dopants and a deterioration of epitaxial layer quality.

From the foregoing it can be appreciated that a need exist for a low temperature process for forming thin epitaxial layers which does not result in degradation of the epitaxy.

SUMMARY OF THE INVENTION

In accordance with the present invention, the disclosed epitaxial deposition process reduces or eliminates the disadvantages and shortcomings associated with relevant prior art methods for forming thin epitaxial layers. Briefly, according to the present invention, sub-collector buried layers are formed in a semiconductor substrate. Next, the substrate is subjected to a high temperature pre-bake. Thereafter, the temperature is reduced and a relatively thin epitaxial capping layer is deposited onto the substrate by chemical vapor deposition with a silane, preferably, dichlorosilane. Lastly, the deposition temperature is further reduced before depositing the remainder of the desired epitaxial thickness.

BRIEF DESCRIPTION OF THE DRAWINGS

Further features and advantages will become more apparent from the following and more particular description of the various embodiments of the invention, as illustrated in the accompanying drawings, wherein.

DETAILED DESCRIPTION OF THE PREFERRED EMBODIMENT

Figure 1:
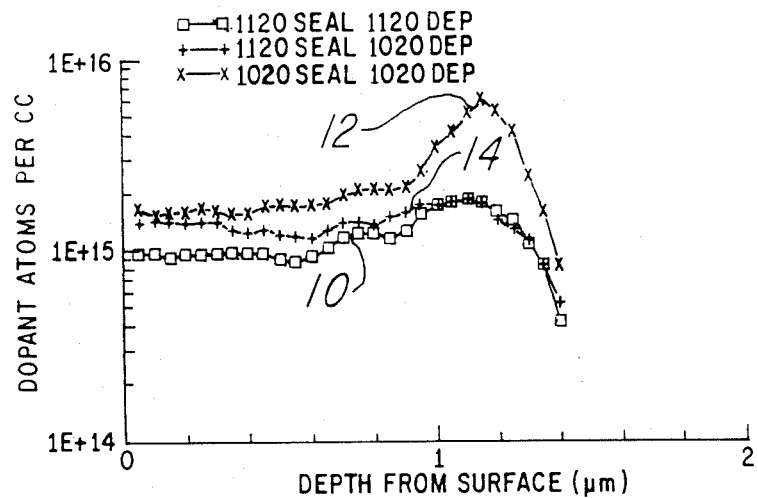
FIG. 1 is a graph illustrating lateral autodoping peak for various embodiments of the invention.

In a preferred embodiment of the present invention, single crystalline wafers of 100 mm diameter and <100> orientation, grown from boron-doped Czochralski crystals with resistivity of 6–10 ohm-cm, were used as substrates. The buried layers were formed by arsenic diffusion to a junction depth of approximately 2.5 microns with a surface concentration of approximately $2E19$ cm$^{-3}$.

After formation of the buried layer the substrate was subjected to a high temperature pre-bake in the temperature range of 1150° C. to 1190° C. for a sufficient time to remove the native oxide present on the surface and to anneal submicroscopic surface damage before deposition is started. In the preferred embodiment the substrate was baked at a temperature of 1180° C. for 4.5 minutes. Care must be taken not to excessively pre-bake the substrate, since excessive pre-baking may lead to over evaporation of the subcollector and excessive side diffusion of the subcollector. Preferably prebaking should last between 1 to 10 minutes.

Next a relatively thin, up to 0.1 micron, epitaxial capping layer is grown on the substrate by low pressure Chemical Vapor Deposition using dichlorosilane as the silicon source gas and arsine as the dopant source. Hydrogen flow was maintained at 200 slm and the pressure at approximately 80 torr. Preferably deposition should occur in the temperature range of 1100° C. to 1130° C. In the preferred embodiment the capping layer was deposited at a temperature of 1120° C. for approximately 0.5 minutes.

After deposition of the capping layer, the deposition temperature is further reduced from the diffusion controlled temperature range to a kinetic controlled deposition temperature, preferably in the range of 900° C. to 1050° C., and the remainder of the desired epitaxial layer, preferably to a combined thickness of 2 microns, is deposited.

The above sequence of steps are preferably performed in a vacuum. The capping layer deposit temperature was selected as the highest temperature which could be consistently used to deposit the cap without risking rapid bell jar deposition. Such temperatures generally occurred for the present invention in the diffusion controlled deposition temperature range whereas the primary deposition was generally performed in the kinetic controlled deposition temperature range.

Table 1 lists the lateral autodoping peak for various deposition sequences.

| Deposit Seal Temp., °C. | Primary Deposit Temp. °C. | Lateral Autodoping Peak atoms/cm$^3$ |
| --- | --- | --- |
| 1120 | 1120 | 1.8E15 |
| NA | 1120 | 3.4E15 |
| 1120 | 1020 | 1.8E15 |
| 1020 | 1020 | 6.0E15 |
| NA | 1020 | 1.2E16 |

The measurements were made using SRP at a distance of 6 mm from the buried layer area which covered 50 cm². The above data illustrates the effectiveness of the present capping layer in reducing the autodoping peak. However, more importantly, it illustrates how the present method produces a low level of autodoping typical only of high temperature deposition processes. The reduction in defect density and autodoping are both believed by the inventor to be attributable to the higher mobility of silicon absorbed atoms on the surface at the higher temperature deposit of the capping seal. This mobility allows the arsenic atoms to be "crowded out" by the silicon atoms which then become incorporated at preferred lattice sites.

The low temperature deposition process of the present method increases dopant incorporation efficiency since the mobility of the silicon atoms arriving at the surface decreases as the temperature is lowered. This, consequently allows more dopant atoms to remain at incorporation sites and become covered by arriving silicon atoms. Incorporation efficiency is defined as the quotient of the ratio of arsenic atoms to silicon atoms introduced into the system through the gas stream to the ratio of arsenic to silicon atoms incorporated in the epitaxial layer.

Figure 2:
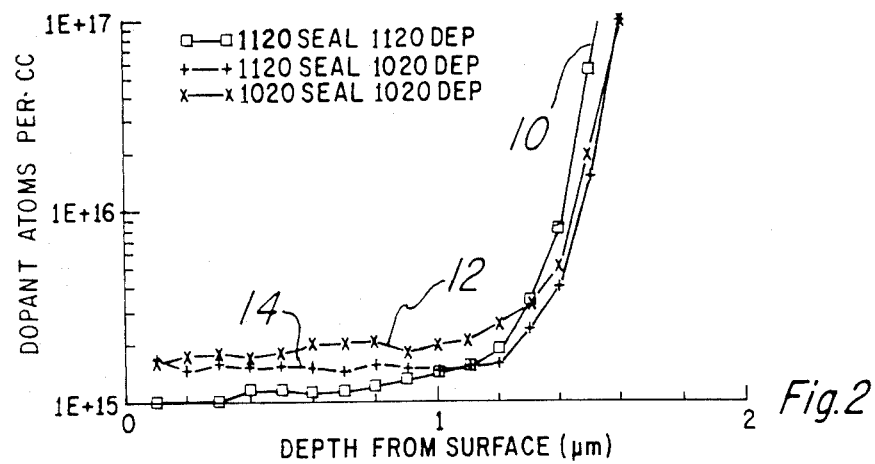
FIG. 2 is a graph illustrating vertical autodoping tail for various embodiments of the invention.

Referring now to the drawing figures, wherein like reference numerals designate like or corresponding parts throughout, FIG. 1 shows a graph comparing the peak lateral autodoping profiles of epitaxial layers formed by various embodiments of the present invention. A peak autodoping of 1.75E15 cm$^{-3}$ is shown to occur with a 1120° C. seal and 1020° C. primary deposition process 14. As shown, the peak autodoping concentration is no greater than that attained at the higher deposition temperature of process 10 and nearly ⅓ of that attained by process 12. FIG. 2 is a graph illustrating the vertical autodoping profiles for the three processing sequences of FIG. 1. As shown, vertical autodoping is also reduced for process 14 as compared to process 12. Data for FIGS. 1 and 2 were obtained from comparing spreading resistance profiles 0.25 inches from the buried layer for the three processes.

Figure 3:
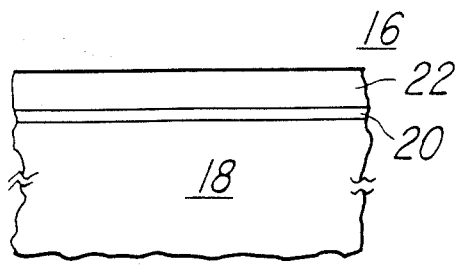
FIG. 3 is a cross-sectional view of a structural embodiment of the present invention.

Referring now to FIG. 3, there is shown a semiconductor device 16 formed in accordance with the present invention. Device 16 comprises a semiconductor substrate/body 18, a first epitaxial layer 20 disposed on body 18, and a second epitaxial layer 22 disposed on the first epitaxial layer 20. As stated herein above the first epitaxial layer is formed substantially thinner than the second epitaxial layer. The first epitaxial layer is formed over the higher mobility silicon adsorbed atoms present on the surface of the substrate/body 18 at the higher deposit seal temperature. Formation of the first epitaxial layer 20 at the higher deposition temperature allows the silicon absorbed atoms to migrate to preferred lattice sites as previously discussed.

TECHNICAL ADVANTAGES OF THE INVENTION

From the foregoing the fabrication steps of a thin epitaxial layer have been disclosed. A technical advantage of the disclosed epitaxial process is that thin epitaxial layers in the one to two micron thickness range can be fabricated at low temperatures without an increase in lateral autodoping concentration. Therefore an attendant technical advantage of the invention is that the possibility of inversion of a lightly doped p-type substrate in the device isolation region is diminished thus ensuring the completeness of the device isolation.

Another technical advantage of the invention presented is that vertical autodoping is also reduced. Thus, a sharper transition is obtained from the subcollector dopant concentration to the epitaxial layer concentration. Another technical advantage of minimizing vertical autodoping in accordance with the present invention is that a higher breakdown voltage can be obtained for a given epitaxial thickness by allowing a higher voltage to be applied before the base "bumps" the subcollector, thus shorting out the device.

Yet another technical advantage of the invention is that the improvements in autodoping control, yield devices with reduced collector-base capacitance which allows the fabrication of higher speed devices.

Yet still another technical advantage of the present process for fabricating thin epitaxial layers is that it decreases bird's head height by reducing the oxide thickness required for device isolation.

The values and ranges discussed herein are given for a preferred embodiment of the present invention, of course these values may vary as the parameters are changed. Therefore it is to be understood that many changes in detail may be made as a matter of engineering choices without departing from the spirit and scope of the invention, as defined by the appended claims.

What is claimed:

1. A method of forming a thin epitaxial layer, comprising the steps of:
   providing a silicon substrate;
   prebaking said substrate in the temperature range between approximately 1150° C. and 1190° C.;
   reducing said temperature to the range between approximately 1100° C. and 1130° C.;
   depositing a thin capping epitaxial layer up to approximately 0.1 micron by low pressure chemical vapor deposition with a silane;
   reducing said temperature to the range between approximately 900° C. and 1050° C.; and
   depositing a primary epitaxial layer to a desired thickness.

2. The method of claim 1, further including the step of forming a sub-collector buried layer in said substrate before said prebaking step.

3. The method of claim 1 wherein said silane is dichlorosilane.

4. The method of claim 3 wherein said low pressure is in the range between approximately 60 and 100 torr.

5. The method of claim 4 wherein said prebaking step is performed until native oxides are removed.

6. The method of claim 1 wherein said primary epitaxial layer is deposited in a thickness range between approximately 0 and 2 microns.

7. A method of forming a thin epitaxial layer, comprising the steps of:
   providing a semiconductor substrate;
   baking said substrate between approximately 1150° C. and 1190° C.;
   depositing a first epitaxial layer of a thickness in the range between approximately 0 and 0.1 micron at a temperature in the range between approximately 1100° C. to 1130° C.; and
   depositing a primary epitaxial layer to a desired thickness at a temperature in the range between approximately 900° C. and 1050° C.

8. The method of claim 7 wherein said depositing steps are performed by low pressure chemical vapor deposition of a silane.

9. The method of claim 8 wherein said silane is dichlorosilane.

10. A method of forming an epitaxial layer, comprising the steps of:
  providing a semiconductor body;
  baking said semiconductor body at a first temperature sufficient to remove native oxide;
  reducing said first temperature to a second temperature in the diffussion controlled deposition temperature range and forming a first epitaxial layer on said semiconductor body; and
  reducing said second temperature to a third temperature in the kinetic controlled deposition temperature range and forming a primary epitaxial layer to a desired thickness on said semiconductor body, said first epitaxial layer being thinner than said second epitaxial layer.